(12) United States Patent
You et al.

(10) Patent No.: US 11,605,736 B2
(45) Date of Patent: Mar. 14, 2023

(54) LOW-CAPACITANCE STRUCTURES AND PROCESSES

(71) Applicant: Taiwan Semiconductor Manufacturing Co., Ltd., Hsinchu (TW)

(72) Inventors: Jia-Chuan You, Taoyuan County (TW); Chia-Hao Chang, Hsinchu (TW); Tien-Lu Lin, Hsinchu (TW); Yu-Ming Lin, Hsinchu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 12 days.

(21) Appl. No.: 17/353,089

(22) Filed: Jun. 21, 2021

(65) Prior Publication Data

US 2021/0313464 A1 Oct. 7, 2021

Related U.S. Application Data

(62) Division of application No. 16/441,107, filed on Jun. 14, 2019, now Pat. No. 11,043,594.

(60) Provisional application No. 62/823,827, filed on Mar. 26, 2019.

(51) Int. Cl.
*H01L 29/76* (2006.01)
*H01L 29/78* (2006.01)
*H01L 29/66* (2006.01)
*H01L 29/417* (2006.01)

(52) U.S. Cl.
CPC ...... *H01L 29/785* (2013.01); *H01L 29/41791* (2013.01); *H01L 29/66795* (2013.01)

(58) Field of Classification Search
None
See application file for complete search history.

(56) References Cited

U.S. PATENT DOCUMENTS

| | | | |
|---|---|---|---|
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |

(Continued)

*Primary Examiner* — Hung K Vu
(74) *Attorney, Agent, or Firm* — Haynes and Boone, LLP

(57) ABSTRACT

Semiconductor devices and methods of forming the same are provided. In one embodiment, a semiconductor device includes a fin extending from a substrate, a gate structure over a channel region of the fin, a source/drain contact over a source/drain region of the fin, a spacer extending along a sidewall of the gate structure, a liner extending along a sidewall of the source/drain contact, a gate contact via over and electrically coupled to the gate structure, and a source/drain contact via over and electrically coupled to the source/drain contact. The gate contact via extends through a first dielectric layer such that a portion of the first dielectric layer interposes between the gate contact via and the spacer. The source/drain contact via extends through a second dielectric layer such that a portion of the second dielectric layer interposes between the source/drain contact via and the liner.

20 Claims, 15 Drawing Sheets

(56) References Cited

U.S. PATENT DOCUMENTS

| | | | |
|---|---|---|---|
| 9,236,300 B2 | 1/2016 | Liaw | |
| 9,520,482 B1 | 12/2016 | Chang et al. | |
| 9,576,814 B2 | 2/2017 | Wu et al. | |
| 9,859,393 B2 | 1/2018 | Tak | |
| 10,679,859 B2 * | 6/2020 | Cheng | H01L 23/53209 |
| 2014/0199837 A1 * | 7/2014 | Hung | H01L 21/31144 |
| | | | 438/675 |
| 2018/0190809 A1 | 7/2018 | Huang | |
| 2018/0308797 A1 * | 10/2018 | Tsai | H01L 29/41766 |
| 2018/0337126 A1 | 11/2018 | Zhang | |

* cited by examiner

LOW-CAPACITANCE STRUCTURES AND PROCESSES

PRIORITY DATA

This application is a divisional application of U.S. patent application Ser. No. 16/441,107, filed Jun. 14, 2019, which claims the benefit of U.S. Provisional Application No. 62/823,827, filed Mar. 26, 2019, each of which is incorporated by reference herein in its entirety.

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. FinFETs are compatible with conventional complementary metal-oxide-semiconductor (CMOS) processes and their three-dimensional structure allows them to be aggressively scaled while maintaining gate control and mitigating SCEs. However, even with the introduction of FinFETs, aggressive scaling down of IC dimensions has resulted in increased parasitic capacitance (e.g., between a FinFET gate and source/drain regions or source/drain contacts). As a result of such increased parasitic capacitance, device performance is degraded. Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
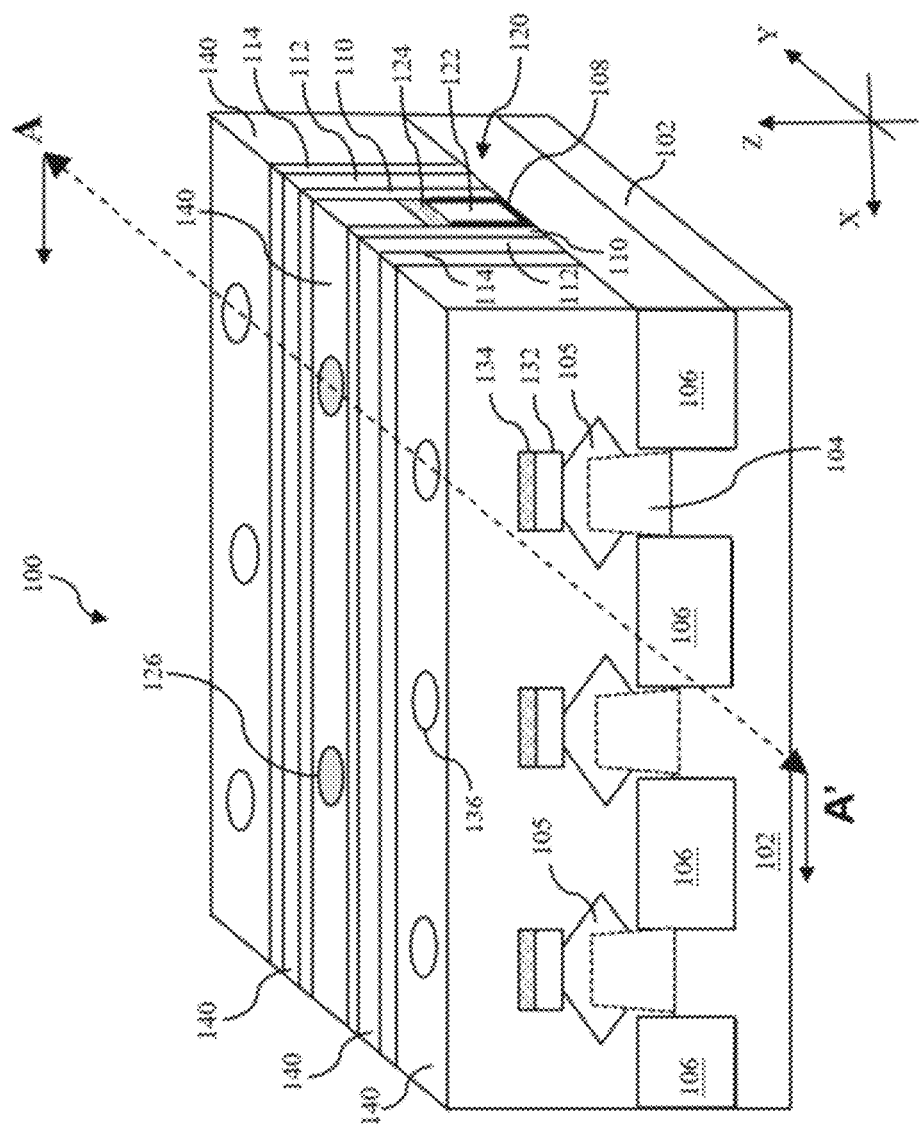
FIG. 1 is perspective view of an embodiment of a FinFET device according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors or fin-type multi-gate transistors referred to herein as FinFET devices. Such a device may include a P-type metal-oxide-semiconductor FinFET device or an N-type metal-oxide-semiconductor FinFET device. The FinFET device may be a dual-gate device, tri-gate device, bulk device, silicon-on-insulator (SOI) device, and/or other configuration. One of ordinary skill may recognize other embodiments of semiconductor devices that may benefit from aspects of the present disclosure. For example, some embodiments as described herein may also be applied to gate-all-around (GAA) devices, Omega-gate (Ω-gate) devices, or Pi-gate (Π-gate) devices.

This application relates to semiconductor device structures and methods of forming the same, particularly high-speed semiconductor device structures and methods. A semiconductor device structure of the present disclosure includes low-k (dielectric constant less than 4) dielectric features over gate structures and source/drain contact and the gate contact vias and source/drain contact vias extending through the low-k dielectric features. According to methods of the present disclosure, the low-k dielectric features are formed after the formation of the gate contact vias and the source/drain contact vias in self-aligned dielectric features and after removal of the self-aligned dielectric features. In some instances, the removal of the self-aligned dielectric features may laterally remove portions of gate spacers and liners and increases the volume of the opening for low-k dielectric features. In some instances, the low-k dielectric features may be porous or include air pockets. The low-k dielectric features formed in place of the self-aligned dielectric features reduce parasitic capacitance and improve performance of the semiconductor device.

Illustrated in FIG. 1 is a FinFET device 100. The FinFET device 100 includes one or more fin-based, multi-gate field-effect transistors (FETs). While the embodiments of the present disclosure are described using the FinFET device 100 in FIG. 1 as an example, the present disclosure is not so limited and may be applicable to other type of FETs that include semiconductor features other than the fin-elements shown in figures of the present disclosure. The FinFET device 100 includes a substrate 102, at least one fin-element 104 rising from the substrate 102 and extending along Y direction, isolation regions 106, and a gate structure 120 disposed on and around the fin-element 104. The substrate 102 may be a semiconductor substrate such as a silicon substrate. The substrate may include various layers, including conductive or insulating layers formed on a semiconductor substrate. The substrate 102 may include various doping configurations depending on design requirements as is known in the art. Further, in some embodiments, the substrate 102 may include an epitaxial layer (epi-layer), the substrate 102 may be strained for performance enhancement, the substrate 102 may include an SOI structure, and/or the substrate 102 may have other suitable enhancement features.

The fin-element 104 (or fin 104), like the substrate 102, may comprise silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, InGaAs, GaInP, and/or GaInAsP; or combinations thereof. The fins 104 may be fabricated using suitable processes including photolithography and etch processes. The photolithography process may include forming a photoresist layer (resist) overlying the substrate 102 (e.g., on a silicon layer), exposing the resist to patterned radiation, performing post-exposure bake processes, and developing the resist to form a masking element including the resist. In some embodiments, patterning the resist to form the making element may be performed using an electron beam (e-beam) lithography process. The masking element may then be used to protect regions of the substrate 102 while an etch process forms recesses into the substrate 102, thereby leaving an extending fin 104. The recesses may be etched using a dry etch (e.g., chemical oxide removal), a wet etch, and/or other suitable processes. Numerous other embodiments of methods to form the fins 104 on the substrate 102 may also be used.

Each of the plurality of fins 104 also include a source/drain region where the source/drain feature 105 is formed in, on, adjacent and/or surrounding the fin 104. It is noted that in a FET, such as the FinFET device 100, a channel region is sandwiched between a source region and a drain region. For ease of reference and description, the source region and the drain region on different sides of a channel region is referred generally as the source/drain region. The source/drain features 105 may be epitaxially grown over the fins 104. A channel region of a transistor is disposed within the fin 104, underlying the gate structure 120, along a plane substantially parallel to a plane defined by section A-A' of FIG. 1. In some examples, the channel region of the fin includes a high-mobility material such as germanium, as well as any of the compound semiconductors or alloy semiconductors discussed above and/or combinations thereof. High-mobility materials include those materials with an electron mobility greater than silicon, which has an intrinsic electron mobility at room temperature (300 K) of around 1350 cm$^2$/V-s and a hole mobility of around 480 cm$^2$/V-s, in some instances.

The isolation regions 106 may be shallow trench isolation (STI) features. Alternatively, a field oxide, a LOCOS feature, and/or other suitable isolation features may be implemented on and/or within the substrate 102. The isolation regions 106 may be composed of silicon oxide, silicon nitride, silicon oxynitride, fluorine-doped silicate glass (FSG), a low-k dielectric, combinations thereof, and/or other suitable material known in the art. In an embodiment, the isolation structures are STI features and are formed by etching trenches in the substrate 102. The trenches may then be filled with isolating material, followed by a chemical mechanical polishing (CMP) process. However, other embodiments are possible. In some embodiments, the isolation regions 106 may include a multi-layer structure.

The gate structure 120 includes a gate dielectric layer 108, and a metal layer 122 formed over the gate dielectric layer 108. In some embodiments, the gate dielectric layer 108 may include an interfacial layer formed over the channel region of the fin 104 and a high-K dielectric layer over the interfacial layer. The interfacial layer of the gate dielectric layer 108 may include a dielectric material such as silicon oxide layer ($SiO_2$) or silicon oxynitride (SiON). The high-K dielectric layer of the gate dielectric layer 108 may include $HfO_2$, $TiO_2$, HfZrO, $Ta_2O_3$, $HfSiO_4$, $ZrO_2$, $ZrSiO_2$, combinations thereof, or other suitable materials. In still other embodiments, the gate dielectric layer 108 may include silicon dioxide or another suitable dielectric. The gate dielectric layer 108 may be formed by chemical oxidation, thermal oxidation, atomic layer deposition (ALD), physical vapor deposition (PVD), chemical vapor deposition (CVD), and/or other suitable methods. The metal layer 122 may include a conductive layer such as W, TiN, TaN, WN, Re, Ir, Ru, Mo, Al, Cu, Co, Ni, combinations thereof, and/or other suitable compositions. In some embodiments, the metal layer 122 may include a first group of metal materials for N-type FinFETs and a second group of metal materials for P-type FinFETs. Thus, the FinFET device 100 may include a dual work-function metal gate configuration. For example, the first metal material (e.g., for N-type devices) may include metals having a work function substantially aligned with a work function of the substrate conduction band, or at least substantially aligned with a work function of the conduction band of the channel region of the fin 104. Similarly, for example, the second metal material (e.g., for P-type devices) may include metals having a work function substantially aligned with a work function of the substrate valence band, or at least substantially aligned with a work function of the valence band of the channel region of the fin 104. Thus, the metal layer 122 may provide a gate electrode for the FinFET device 100, including both N-type and P-type FinFET devices 100. In some embodiments, the metal layer 122 may alternately include a polysilicon layer. The metal layer 122 may be formed using PVD, CVD, electron beam (e-beam) evaporation, and/or other suitable process.

In some embodiments, a replacement gate process (or gate replacement process) may be used to form the gate structure 120. In a replacement gate process, a dummy gate (or a sacrificial gate structure, or a placeholder gate structure) or is first formed of a semiconductor material, such as polysilicon, over the channel region to serve as a placeholder for the final gate structure is to be formed. After features around the dummy gate are fabricated, the dummy gate will be removed and replaced with the final gate structure. When the replacement gate process is used, multiple spacers (or spacer layers) may be formed over the dummy gate. Spacers formed on the top surface of the dummy gate structure may be removed at a later stage to allow excess to and removal of the dummy gate structure. In some embodiments represented in FIG. 1, two spacers—the first spacer 110, the second spacer 112 are formed over the dummy gate. A liner 114 may be formed over the sidewall of the second spacer. The liner 114 may also be regarded as a third spacer. After the dummy gate is removed and replaced by the gate structure 120, these two spacers and the liner may remain along the sidewalls of the gate structure 120. The spacers and the liner may include a dielectric material such as silicon oxide, silicon nitride, silicon carbide, silicon oxynitride, silicon oxy-carbide, silicon carbide nitride, silicon oxycarbide nitride, aluminum oxide, aluminum oxynitride, aluminum nitride, zirconium oxide, zirconium aluminum oxynitride, aluminum nitride, amorphous silicon, or combination thereof.

In some embodiments, to prevent the metal layer 122 from being etched or oxidized in later processes, a gate cap layer 124 may be formed over the metal layer 122. The gate cap layer 124 may be formed of tungsten, cobalt, nickel, ruthenium, titanium, titanium nitride, tantalum, tantalum nitride. In some implementations, a self-aligned gate dielectric feature may be formed over the gate cap layer 124. In FIG. 1, the self-aligned gate dielectric feature has been removed after the formation of the gate contact via 126 through the gate dielectric cap and replaced with a low-k dielectric feature 140. In the embodiments represented in FIG. 1, the gate contact via 126 extends vertically through the low-k dielectric feature 140 and is electrically coupled to metal layer 122 via the gate cap layer 124. Collectively, the gate dielectric layer 108, the metal layer 122, and the gate cap layer 124 may be referred to as the gate structure 120.

The FinFET device 100 may include a source/drain contact 132 electrically coupled to the source/drain feature 105. To electrically couple the source/drain contact 132 to the source/drain feature 105, the source/drain feature 105 may be recessed and a silicide layer may be formed between the recessed source/drain feature 105 and the source/drain contact 132. In some implementations, an etch stop layer may be formed over the source/drain feature 105 before the source/drain feature 105 is recessed. Then a silicide precursor, such as nickel, cobalt and titanium, is deposited over the recessed source/drain feature 105. A silicide feature, such as nickel silicide, cobalt silicide or titanium silicide may be formed over the recessed source/drain feature 105 after annealing. The silicide feature may reduce the contact resistance between the source/drain feature 105 and the source/drain contact 132. In FIG. 1, the self-aligned source/drain dielectric feature has been removed after the formation of the source/drain contact via 136 through the self-aligned source/drain dielectric feature and replaced with a low-k dielectric feature 140. In the embodiments represented in FIG. 1, the source/drain contact via 136 extends vertically through the low-k dielectric feature 140 and is electrically coupled to the source/drain contact 132. The source/drain cap layer 134 may be formed of tungsten, cobalt, nickel, ruthenium, titanium, titanium nitride, tantalum, tantalum nitride. In some implementations, a self-aligned source/drain dielectric feature may be formed over the source/drain cap layer 134. Thereafter, a source/drain contact via 136 may be formed over the source/drain cap layer 134 for routing through a metal line in a metal layer or an interconnect structure. Although not shown in FIG. 1, the silicide feature, the source/drain contact 132, the source/drain cap layer 134, and the source/drain contact via 136 may be formed over the source/drain feature 105 while the source/drain feature 105 is generally covered by the self-aligned source/drain dielectric feature. In FIG. 1, the self-aligned source/drain dielectric feature is not shown because it has been removed and replaced with the low-k dielectric feature 140.

As noted above, aggressive scaling down of IC dimensions has resulted in increased parasitic capacitance (e.g., between a gate structure and a source/drain region or between a gate contact via and a source/drain contact via), thus degrading device performance. Conventionally, the self-aligned dielectric features, through which the gate contact vias and source/drain contact via are formed, are not formed of dielectric materials with low dielectric constants (i.e. low-k, dielectric constant smaller than 4) as low-k dielectric materials may lead to defects and shorting. When the self-aligned dielectric features are formed of dielectric material with high dielectric constants (i.e. high-k, dielectric constant greater than 4), the high-k self-aligned dielectric features contribute to parasitic capacitance that impacts the performance of the semiconductor device.

Embodiments of the present disclosure offer advantages over the existing art. Although it is understood that other embodiments may offer different advantages, not all advantages are necessarily discussed herein, and no particular advantage is required for all embodiments. For example, embodiments discussed herein include methods that replaces the high-k self-aligned dielectric features with low-k dielectric features after the gate contact vias and source/drain contact vias are formed through the high-k self-aligned dielectric features. With the high-k self-aligned dielectric features being replaced with the low-k dielectric feature, the semiconductor devices formed using these methods have lower parasitic capacitance and improved performance. In the semiconductor devices according to the present disclosure, because the low-k dielectric features do not need to withstand processes for formation of the gate contact vias and source/drain contact vias, they may include pores or air pockets to further reduce parasitic capacitance.

Figure 2:
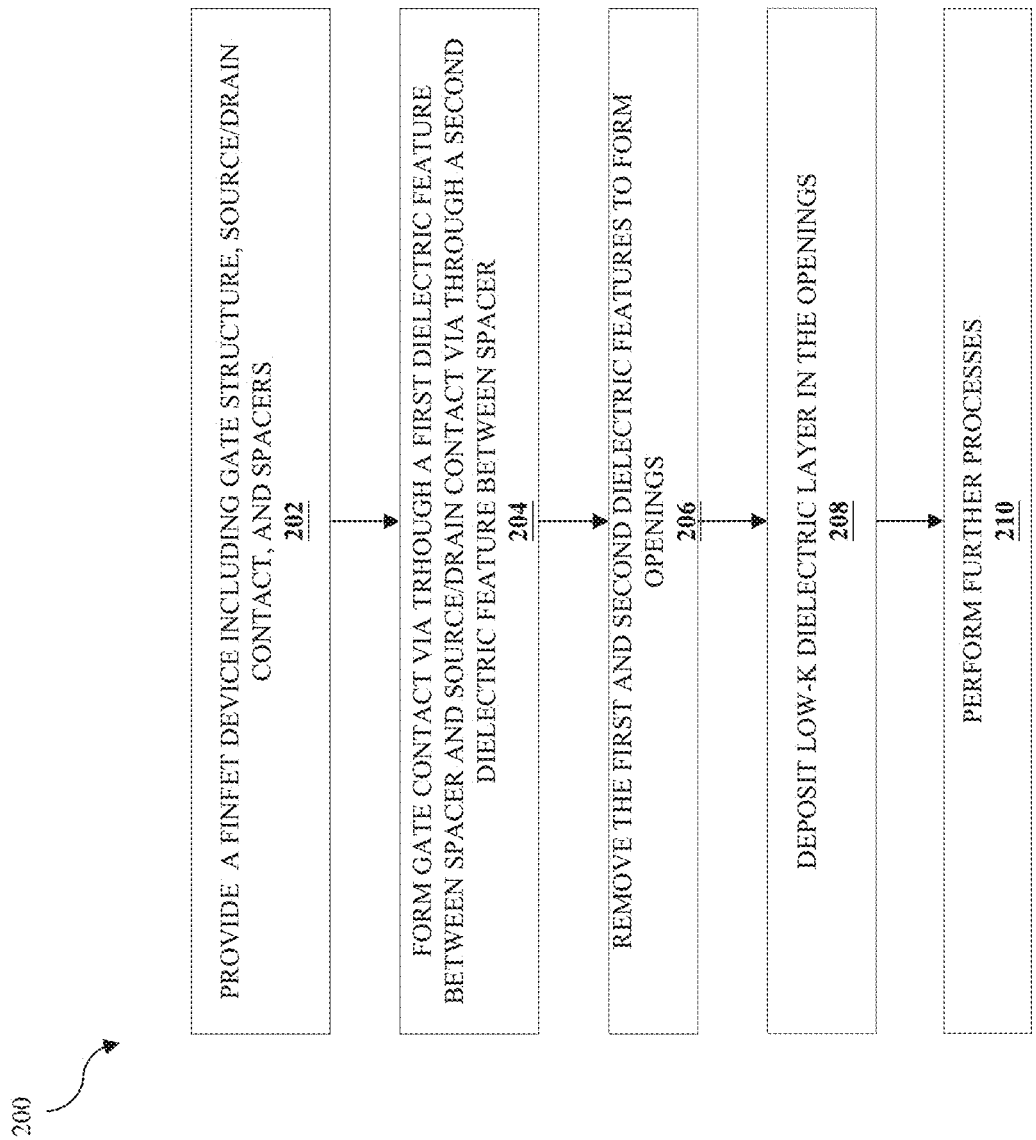
FIG. 2 is a flow chart of a method of fabricating a low-parasitic-capacitance semiconductor device, in accordance with some embodiments.

Referring now to FIG. 2, illustrated is a method 200 of fabricating a semiconductor device 300 (e.g., such as a FinFET device, also referred to as device 300) having low parasitic capacitance, in accordance with one or more embodiments. In some embodiments, the method 200 may be used to fabricate the FinFET device 100, described above with reference to FIG. 1. Thus, one or more aspects discussed above with reference to the FinFET device 100 may also apply to the method 200. Additionally, FIGS. 3-6, 7A, 7B, 8A, and 8B provide cross-sectional views, along a plane substantially parallel to a plane defined by section A-A' of FIG. 1, of an exemplary device 300 fabricated according to one or more steps of the method 200 of FIG. 2. It is noted, while FIG. 1 and FIG. 3 may include different device features and aspects, they may nevertheless be snapshots of a single semiconductor device.

It is understood that parts of the method 200 and/or the semiconductor device 300 may be fabricated by a well-known CMOS technology process flow, and thus some processes are only briefly described herein. In addition, as described above, the device 300 may share aspects of the device 100, thus some aspects and/or processes of the device 300 are only discussed briefly for purposes of clarity in understanding. Further, the semiconductor device 300 may include various other devices and features, such as additional transistors, bipolar junction transistors, resistors, capacitors, diodes, fuses, etc., but is simplified for a better understanding of the inventive concepts of the present disclosure. Further, in some embodiments, the semiconductor device 300 includes a plurality of semiconductor devices (e.g., transistors), which may be interconnected.

In various embodiments, the device 300 may be an intermediate device fabricated during processing of an integrated circuit, or portion thereof, that may comprise static random access memory (SRAM) and/or other logic circuits, passive components such as resistors, capacitors, and inductors, and active components such as P-channel field-effect transistors (PFETs), N-channel FETs (NFETs), metal-oxide-semiconductor field-effect transistors (MOSFETs), high voltage transistors, high frequency transistors, other memory cells, and/or combinations thereof.

Figure 3:
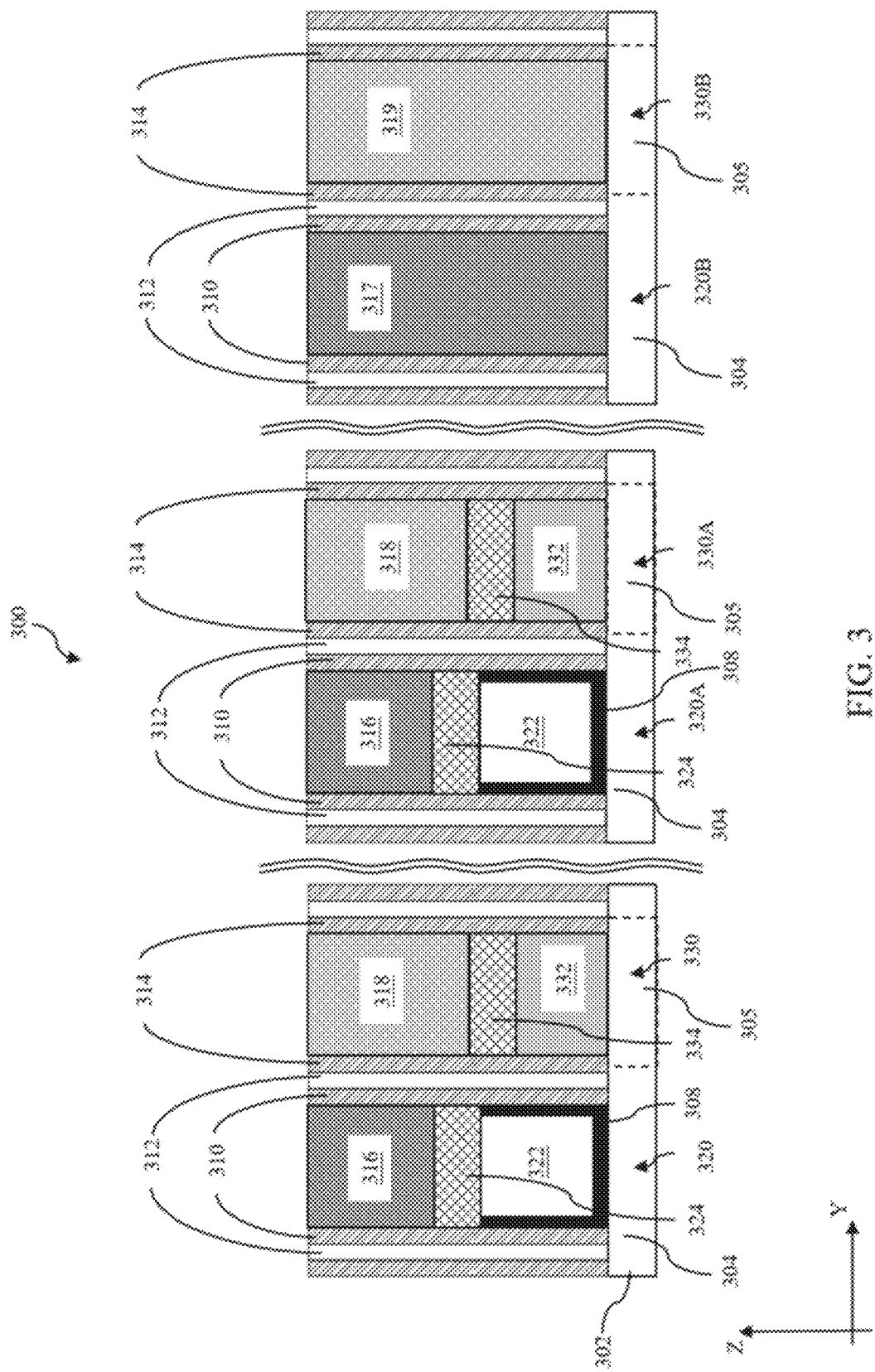
FIGS. 3-7, 8A, 8B, 9A, and 9B provide cross-sectional views along a plane substantially parallel to a plane defined by section A-A' of FIG. 1, of an exemplary device fabricated according to one or more steps of the method of FIG. 2.

Referring now to FIGS. 2 and 3, the method 200 includes a block 202 where a FinFET device 300 is provided. While being fabricated, the FinFET device 300 may be referred to as a workpiece from time to time herein. In that sense, a workpiece having the FinFET device 300 thereon is provided at block 202. The FinFET device 300 may include a gate structure 320, a source/drain contact 332, and at least two spacers formed along a sidewall of the gate structure 320. Referring to FIG. 3, illustrated therein is a FinFET device 300 including a fin 302 that extends from a substrate. The fin 302 includes channel regions 304 and source/drain region 305 adjacent to the channel region 304. The FinFET device 300 also includes the gate structure 320 that includes a gate dielectric layer 308, and a metal layer 322 over the gate dielectric layer 308. In some embodiments, the substrate, the fin 302, the gate dielectric layer 308, and the metal layer 322 may be substantially similar to the substrate 102, the fin-elements 104, the gate dielectric layer 108, and the metal layer 122 discussed above with reference to FIG. 1. In some examples, the metal layer 322 has a height of around 30-40 nm. In some implementations, the FinFET device 300 may also include a gate cap layer 324 disposed over the metal layer 322 and a first dielectric feature 316 over the gate cap layer 324. In some instances, the first dielectric feature 316 may be referred to as a first self-aligned contact (SAC) dielectric 316, SAC1 layer 316, or a first self-aligned dielectric feature 316. In the embodiments represented in FIG. 3, the FinFET device 300 includes two spacers—the first spacer 310 and the second spacer 312. In some embodiments, each of the first spacer 310 and the second spacer 312 may be formed to a width between about 5 nm and about 10 nm. As described above, because spacers are formed by depositing spacer material over a dummy gate, followed by removal of the dummy gate, a gate spacer would be illustrated on both sides of the gate structure 320. In some embodiments, the metal layer 322 may be formed of a conductive layer such as W, TiN, TaN, WN, Re, Ir, Ru, Mo, Al, Cu, Co, Ni, combinations thereof, and/or other suitable compositions.

In some embodiments, the source/drain region 305 of the device 300 includes epitaxial source/drain features which may be formed by one or more epitaxial processes. In some cases, the epitaxial source/drain features may be formed in, on, and/or surrounding the fin 302 in the source/drain region 305. It is noted that for ease of illustration, the fin 302 is illustrated in FIGS. 3-7, 8A, 8B, 9A, and 9B as being flat along the Y direction. In some instance, the profile of the fin 302 along line A-A' may not be flat due to various reasons, including, for example, the presence of the source/drain features and recess of the source/drain features. A liner 314 may be formed over the source/drain region 305 and along sidewalls of the second spacers 312. In various examples, after liner material over top surface of the epitaxial source/ drain features are removed, a silicide layer may be formed over the epitaxial source/drain features to reduce contact resistance. In some embodiments, the silicide layer may include Co silicide, Ni silicide, or Ti silicide. Further, in some embodiments, a source/drain contact 332 may be formed over the silicide layer to provide electrical contact to the epitaxial source/drain features. In at least some examples, the source/drain contact 332 includes a Co layer, although other suitable metals may be used without departing from the scope of the present disclosure. In some embodiments represented in FIG. 3, the gate structure 320 is sandwiched between two first spacers 310, which are further sandwiched between two second spacers 312 from both sides of the gate structure 320 along the Y direction. The source/drain contact 332 is sandwiched between two liners 314. In these embodiments, the second spacer 312 is interposed between the first spacer 310 and the liner 314. As illustrated in FIG. 3, a source/drain cap layer 334 may be formed over the source/drain contact 332 and a second dielectric feature 318 (or a second SAC dielectric feature 318, SAC2 layer 318, or the second self-aligned dielectric feature 318) may be formed over the source/drain cap layer 334. The workpiece for the FinFET device 300 in FIG. 3 is planarized using chemical mechanical polishing (CMP) or other suitable grinding techniques.

In some embodiments, the gate cap layer 324 and the source/drain cap layer 334 may be formed of the same material or different materials. For example, the gate cap layer 324 and the source/drain cap layer 334 may be formed of W, Co, Ni, Ru, Ti, Ta, TiN, TaN, combinations thereof, and/or other suitable compositions. In some instances, the gate cap layer 324 and the source/drain cap layer 334 may be formed at a temperature between about 300° C. and about 400° C., under a pressure between about 1 Torr and about 10 Torr. In some implementations, the gate cap layer 324 and the source/drain cap layer 334 may be formed to a thickness between about 3 nm and about 30 nm.

In some embodiments, the first spacer 310, the second spacer 312, the liner 314, the first SAC dielectric feature 316, the second SAC dielectric feature 318 may include a dielectric material such as silicon oxide, silicon nitride, silicon carbide, silicon oxynitride, silicon oxy-carbide, silicon carbide nitride, silicon oxy-carbide nitride, aluminum oxide, aluminum oxynitride, aluminum nitride, zirconium oxide, zirconium aluminum oxynitride, aluminum nitride, amorphous silicon, or a combination thereof. They can be formed using CVD, ALD, plasma-enhanced CVD (PECVD), plasma-enhanced-ALD (PEALD), or other suitable technique. For example, when they are formed of silicon oxide, they may be formed in a temperature range between about 50° C. and about 400° C., under a pressure between about 1 Torr and about 10 Torr, using silane ($SH_4$) and nitrous oxide ($N_2O$) as precursors. When they are formed of silicon nitride, they may be formed in a temperature range between about 250° C. and about 500° C., under a pressure between about 1 Torr and about 10 Torr, using dichlorosilane (DCS) and ammonia ($NH_3$) as precursors. When they are formed of silicon carbide, they may be formed in a temperature range between about 200° C. and about 450° C., under a pressure between about 1 Torr and about 10 Torr, using precursors having trimethylsilyl groups. When they are formed of silicon oxynitride, they may be formed in a temperature range between about 200° C. and about 450° C., under a pressure between about 1 Torr and about 10 Torr, using silane ($SH_4$) and nitrous oxide ($N_2O$) as precursors. When they are formed of silicon oxy-carbide, they may be formed in a temperature range between about 200° C. and about 450° C., under a pressure between about 1 Torr and about 10 Torr, using Si—C containing gas reagents and oxygen containing gas reagents. When they are formed of silicon carbide nitride, they may be formed in a temperature range between about 200° C. and about 450° C., under a pressure between about 1 Torr and about 10 Torr, using Si—C containing gas reagents and nitrogen containing gas reagents. When they are formed of silicon oxy-carbide nitride, they may be formed in a temperature range between about 200° C. and about 450° C., under a pressure between about 1 Torr and about 10 Torr, using Si—C containing gas reagents and oxygen/nitrogen containing gas reagents. When they are formed of aluminum oxide/aluminum oxynitride/aluminum nitride, they may be formed in a temperature range between about 200° C. and about 400° C., under a pressure between about 1 Torr and about 10 Torr, using trimethylamine (TMA) and water as precursors. When they are formed of zirconium oxide/zirconium aluminum oxide/aluminum nitride, they may be formed in a temperature range between about 200° C. and about 400° C., under a pressure between about 1 Torr and about 10 Torr, using zirconium tetrachloride ($ZrCl_4$), trimethylamine (TMA) and water as precursors. When they are formed of amorphous silicon, they may be formed in a temperature range between about 350° C. and about 530° C., under a pressure between about 0 Torr and about 1 Torr, using silane ($SH_4$) and disilane ($S_2H_6$) as precursors. In some instances, the first spacer 310 and the second spacer 312 may be formed to a thickness between about 0.5 nm and about 15 nm. In some implementations, the first SAC dielectric feature 316 and the second SAC dielectric feature 318 are formed of a dielectric material with a dielectric constant greater than 4.

A cross-section along the A-A' plane may extend through multiple channel regions and source/drain regions where different types of gate routing and source/drain routing are adopted. Multiple regions and features that may not be shown along the same A-A' plane are illustrated in FIG. 3 (as well as in FIGS. 4-7, 8A, 8B, 9A, 9B, 10A, 10B, 11A, and 11B) for illustration purposes and such illustration does not limit the scope of the present disclosure unless otherwise expressly described. In embodiments represented in FIG. 3 (as well as in FIGS. 4-7, 8A, 8B, 9A, 9B, 10A, 10B, 11A, and 11B), the cross-section goes through gate structure 320, source/drain contact structure (including, for example, the source/drain contact 332 and source/drain cap layer 334) 330, gate structure 320A, source/drain contact structure 330A, gate cut feature 320B and source/drain contact isolation feature 330B. In some instances, gate structure 320 and source/drain contact structure 330 may appear in the same plane. In some other instances, gate structure 320A and source/drain contact structure 330A may appear in the same plane. In still other instances, gate cut feature 320B and source/drain contact isolation feature 330B may appear in the same plane. When the gate replacement process is used, the gate cut feature 320B may be formed by filling in a first fill material 317 in openings such that a metal layer, such as metal layer 322, cannot be deposited in the openings. Similarly, the source/drain contact isolation feature 330B may be formed by filling in second fill material 319 in openings such that a source/drain contact layer cannot be deposited in the openings. As shown in FIG. 3, the gate cut feature 320B does not include any gate dielectric layer, metal layer or gate cap layer. Similarly, the source/drain contact isolation feature 330B does not include any source/drain contact or source/drain cap layer. The gate cut feature 320B separate gate structures, such as the gate structure 320A. The source/drain contact isolation feature 330B separate source/drain contact structures, such as the source/drain contact structure 330A. In some embodiments, the first fill material 317 may have the same composition as the first SAC dielectric feature 316 and the second fill material 319 may have the same composition as the second SAC dielectric feature 318. In those embodiments, the first fill material 317 may be deposited along with the formation of the first SAC dielectric feature 316 and the second fill material 319 may be deposited along with the formation of the second SAC dielectric feature 318.

Figure 4:
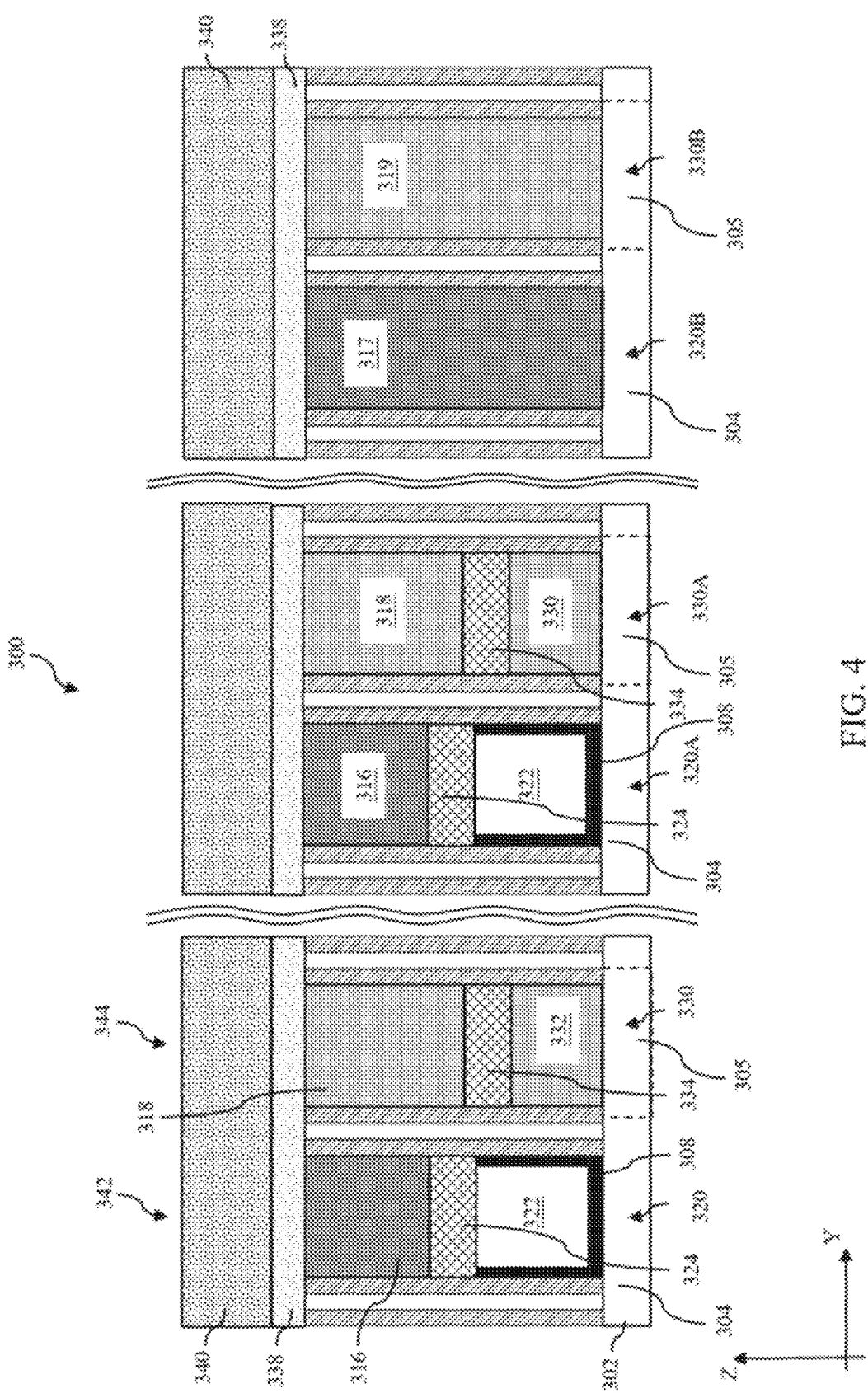
Figure 5:
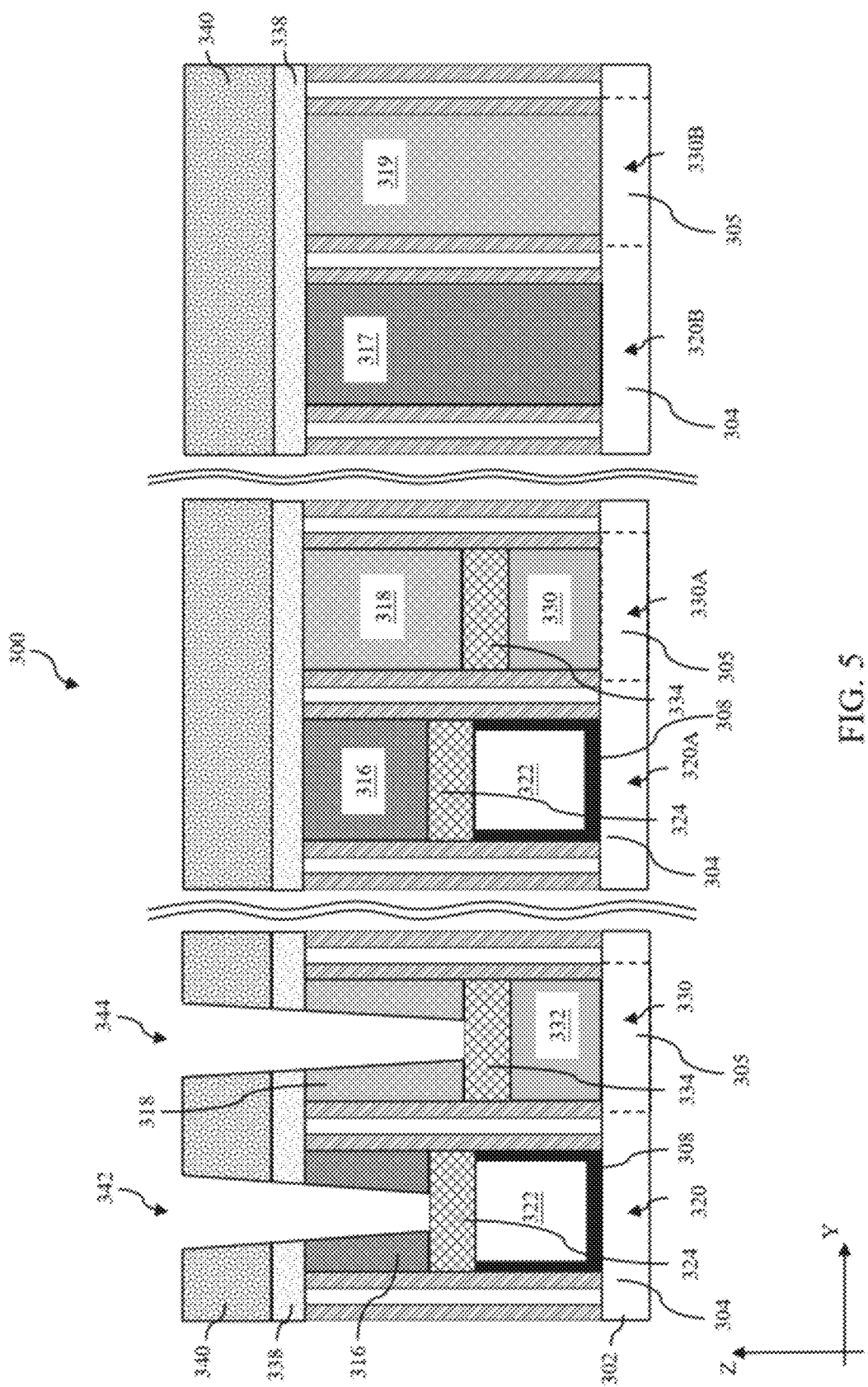

Referring to FIGS. 2, 4, 5, 6, and 7, the method 200 includes a block 204 where a gate contact via 326 and a source/drain contact via 336 are formed. In some embodiments, the gate contact via 326 is formed through the first SAC dielectric feature 316 to electrically couple to the gate cap layer 324 and a source/drain contact via 336 is formed through the second SAC dielectric feature 318 to electrically couple to the source/drain cap layer 334. Reference is now made to FIG. 4. In some embodiments, a metal contact etch stop layer (MCESL) 338 is formed over the workpiece 300. MCESL 338 may be formed of a material selected from the same group of materials for the first spacer 310, the second spacer 312, the liner 314, the first dielectric feature 316, and the second dielectric feature 318 and may be formed using similar precursors and processes, as described above. An interlayer dielectric (ILD) layer 340 is then formed over the MCESL 338. The ILD layer 340 may be formed of semiconductor oxide, semiconductor nitride, or other suitable dielectric materials. For example, the ILD layer 340 may be formed of silicon oxide. Referring now to FIG. 5, a photolithography technique may be used to etch a contact via opening 342 that exposes the gate cap layer 324 and a source/drain contact via opening 344 that exposes the source/drain cap layer 334. An example process may include forming a photoresist layer (resist) over the ILD layer 340, exposing the resist to patterned radiation, performing post-exposure bake processes, and developing the resist to form a patterned resist. The patterned resist is then used as an etch mask to etch the ILD layer 340 and the MCESL 338 to form a patterned hard mask. The patterned hard mask is then used as an etch mask to form the gate contact via opening 342 and the source/drain contact via opening 344 through the first SAC dielectric feature 316 and the second SAC dielectric feature 318, respectively.

Figure 6:
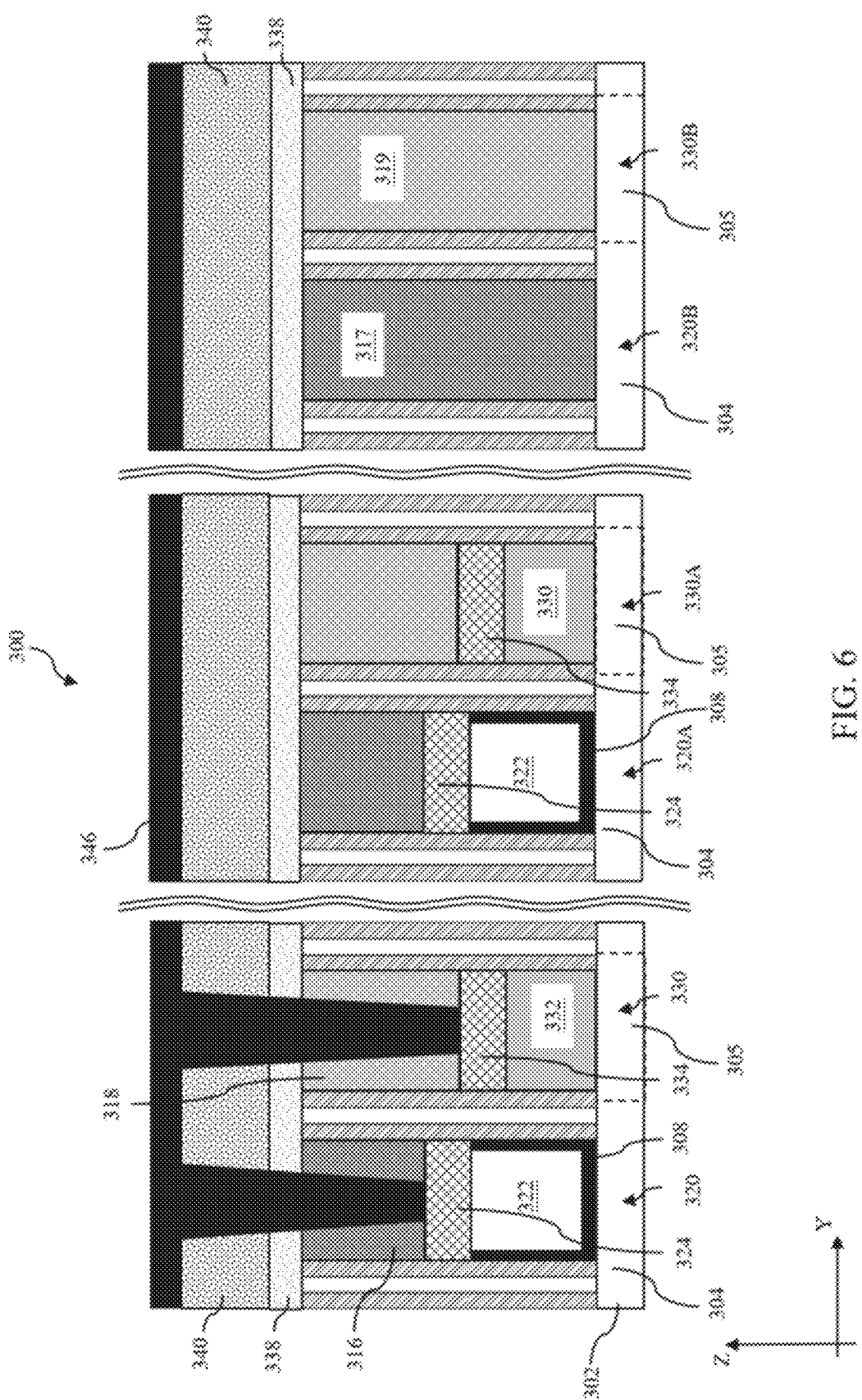
Figure 7:
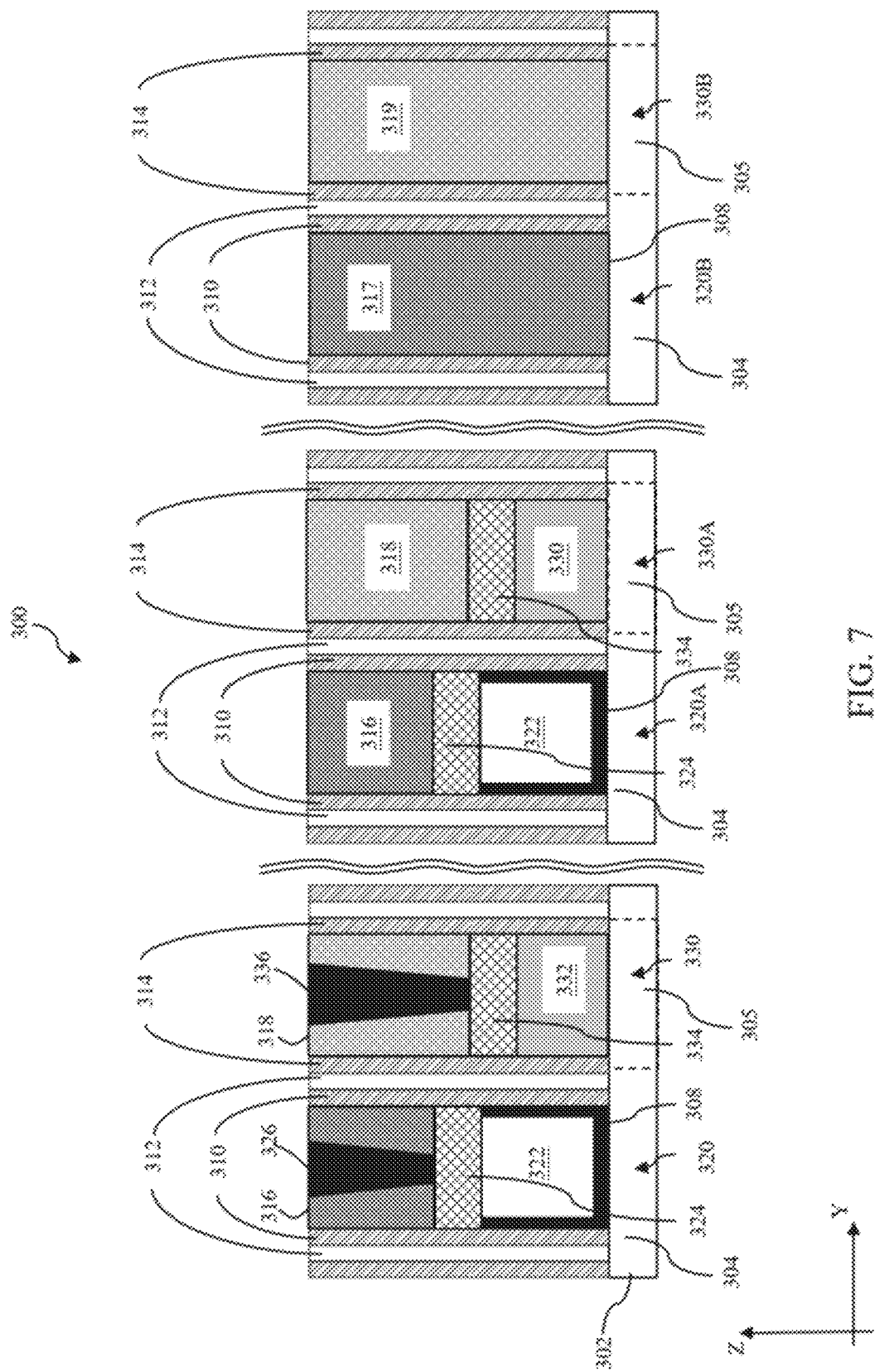

Referring now to FIG. 6, a metal fill material 346 may be deposited in the gate contact via opening 342 and in the source/drain contact via opening 344. The metal fill material may include W, TiN, TaN, WN, Re, Ir, Ru, Mo, Al, Cu, Co, Ni, or combinations thereof and may be deposited using ALD, CVD, PVD, or other suitable technique. Reference is made to FIG. 7. Excess metal fill material 346, the MCESL 338, and the ILD layer 340 are then removed by planarization processes, such chemical mechanical polishing (CMP) to form the gate contact via 326 and the source/drain contact via 336. As shown in FIG. 7, in embodiments where the gate contact via 326 and the source/drain contact via 336 are formed simultaneously, a top surface of the gate contact via 326 and a top surface of the source/drain contact via 336 are coplanar. In alternative embodiments where the gate contact via 326 and the source/drain contact via 336 are formed sequentially, a top surface of the gate contact via 326 and a top surface of the source/drain contact via 336 may not be coplanar.

Figure 8A:
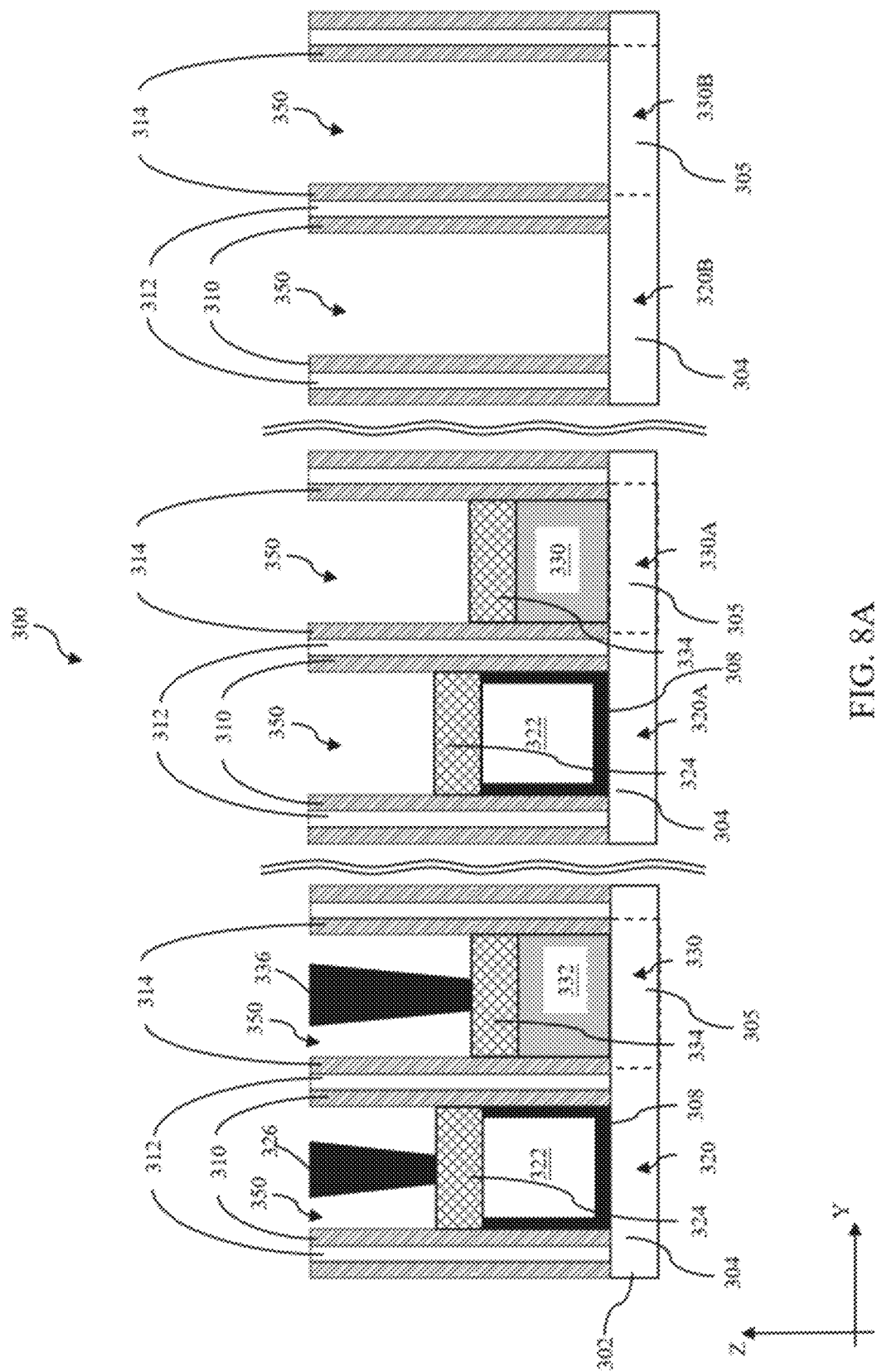
Figure 8B:
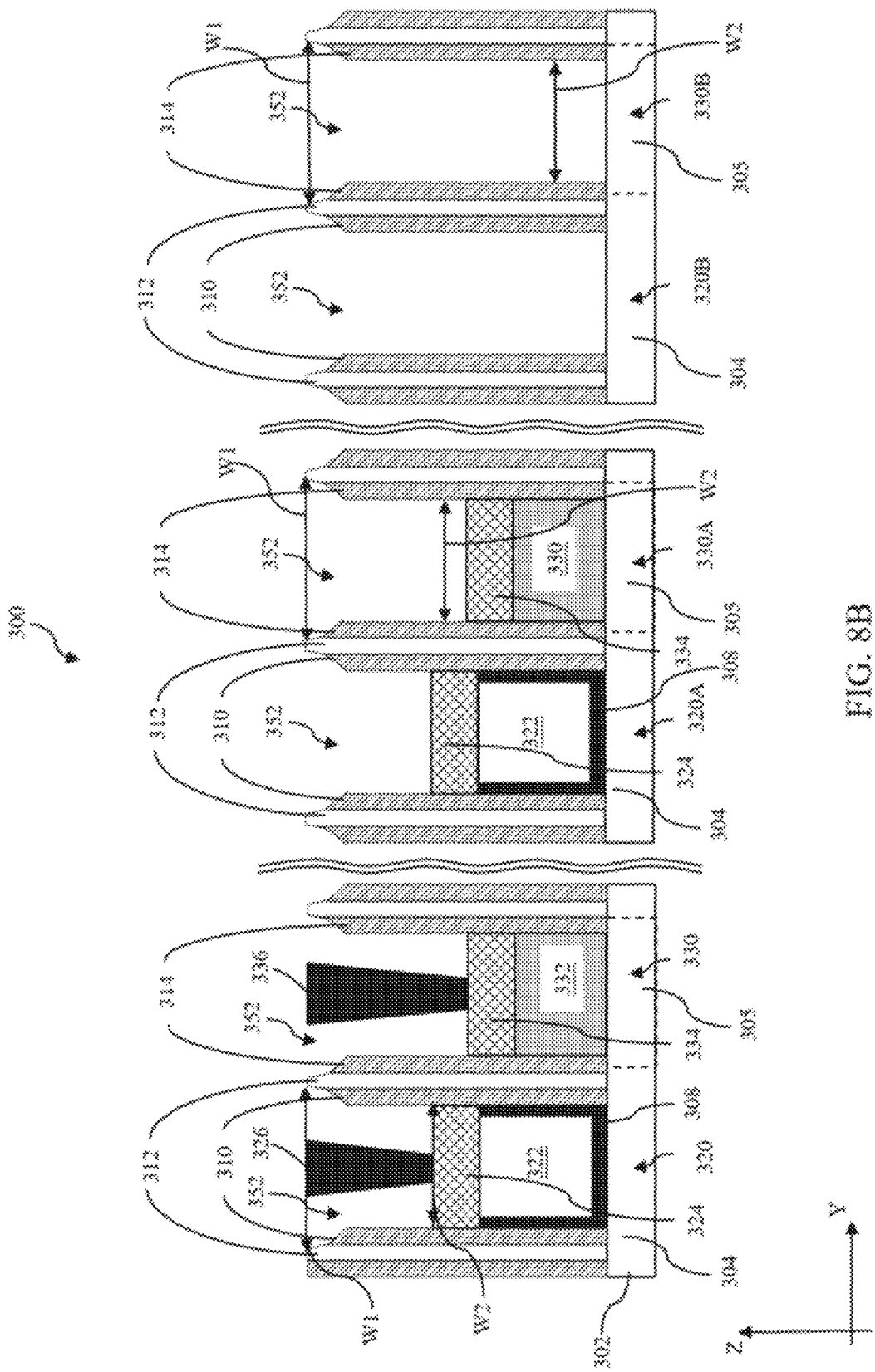

Referring to FIGS. 2, 8A and 8B, the method 200 includes a block 206 where the first SAC dielectric feature 316 (or the first dielectric feature 316) and the second SAC dielectric feature 318 (or the second dielectric feature 318) are removed to form first-type openings 350 in FIG. 8A or second-type openings 352 in FIG. 8B. In some embodiments, the first SAC dielectric feature 316 and the second SAC dielectric feature 318 may be removed by a suitable etch process, such as isotropic or anisotropic dry etch processes. In some implementations, the etch process is highly selective to the first SAC dielectric feature 316 and the second SAC dielectric feature 318 such that the first spacer 310, the second spacer 312, and the liner 314 are not substantially etched. In these implementations, the first-type openings 350 shown in FIG. 8A may be formed. The first-type openings 350 is defined between two of the first spacers 310 and has substantially vertical sidewalls (along Z direction) when viewed along the X direction. In addition, in these implementations, a width of the first-type opening 350 along Y direction is uniform or substantially uniform throughout the depth of the first-type opening 350 along Z direction. In some alternative implementations, the etch process is not highly selective to the first SAC dielectric feature 316 and the second SAC dielectric feature 318 such that the first spacer 310, the second spacer 312, and the liner 314 are etched. In these implementations, the second-type openings 352 shown in FIG. 8B may be formed. In some instances where the second spacer 312 is formed of a material such that it is etched to a less extend than the first spacer 310 and the liner 314, a portion of sidewalls of the second spacer 312 may be exposed, as illustrated in FIG. 8B. For example, the second spacer 312 may be formed of aluminum oxide, aluminum oxynitride, aluminum nitride, zirconium oxide, zirconium aluminum oxynitride, aluminum nitride while the first spacer 310 and the liner 314 may be formed of silicon oxide, silicon nitride, silicon carbide, silicon oxynitride, silicon oxy-carbide, silicon carbide nitride, silicon oxy-carbide nitride, or amorphous silicon. In those instances, an upper portion of the second-type openings 352 may be defined between two of the second spacers 312 and a lower portion thereof may be defined between two of the first spacers 310 and has substantially vertical sidewalls (along Z direction) when viewed along the X direction. In these alternative implementations, the upper portion of the second-type opening 352 has a first width W1 and the lower portion of the second-type opening 352 has a second width W2. The first width W1 is greater than the second width W2.

A cross-sectional view along a plane along line A-A' may or may not extend through the gate contact via and the source/drain contact via at the same time. For example, the cross-sectional plane of the device 300 in FIG. 7 extend through the gate contact via 326 for the gate structure 320 and the source/drain contact via 336 for the source/drain contact structure 330 (including for example the source/drain contact 332 and the source/drain cap layer 334). However, in this example, the cross-sectional plane may miss the gate contact via for the gate structure 320A and the source/drain contact via for the source/drain contact structure 330A (including for example the source/drain contact 332 and the source/drain cap layer 334).

Figure 9A:
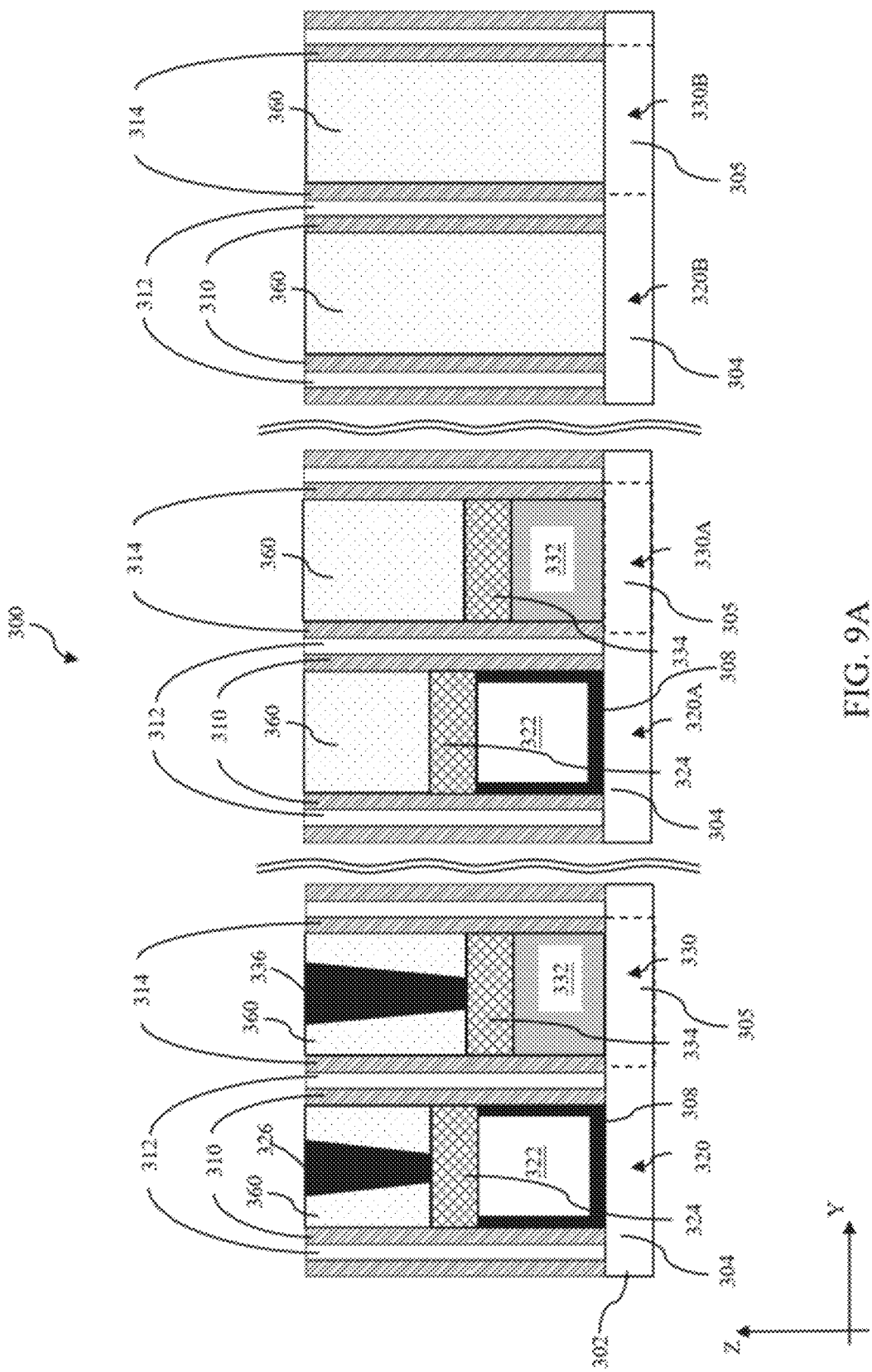
Figure 9B:
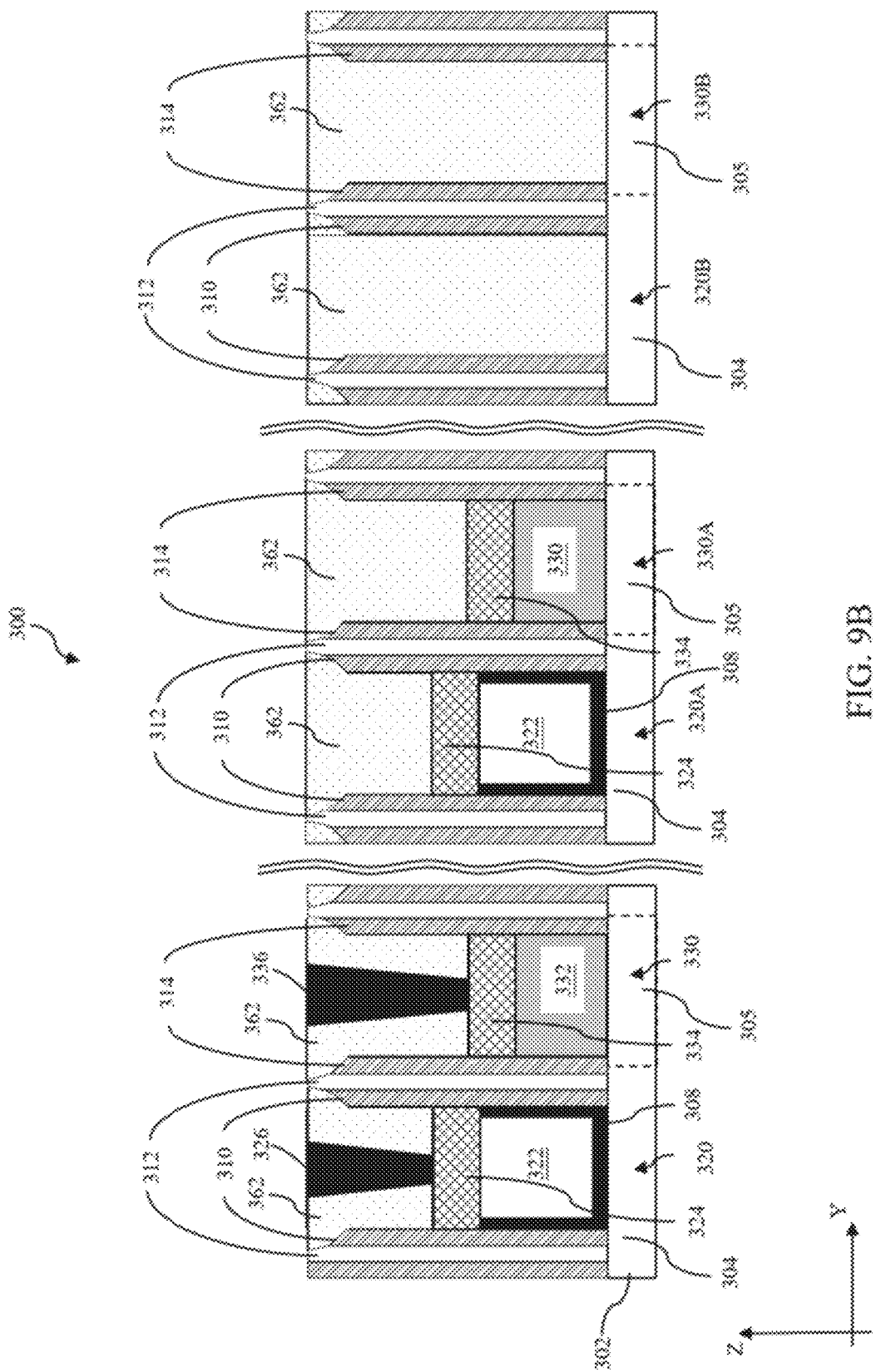

Reference is now made to FIGS. 2, 9A and 9B. The method 200 includes a block 208 where a low-k dielectric material is deposited in the first-type openings 350 in FIG. 8A to form a first-type low-k dielectric feature 360 shown in FIG. 9A or in the second-type openings 352 in FIG. 8B to form a second-type low-k dielectric feature 362 shown in FIG. 9B. In some embodiments, the low-k dielectric material may include silicon, oxygen, and carbon and may be deposited using ALD or CVD at a temperature between about 200° C. and about 450° C. and at a pressure between about 1 Torr and about 10 Torr. In those embodiments, the low-K dielectric material may be formed using a precursor containing silicon and carbon and another precursor containing oxygen and may be silicon oxycarbide. In some alternative embodiments, the low-k dielectric material may include silicon, carbon and nitrogen, and may be deposited using ALD or CVD at a temperature between about 200° C. and about 450° C. and at a pressure between about 1 Torr and about 10 Torr. In those alternative embodiments, the low-K dielectric material may be formed using a precursor containing silicon and carbon and another precursor containing nitrogen and may be silicon carbonitride. In some implementations, the low-k dielectric material has a dielectric constant less than 4 and may be formed to a thickness between about 5 nm and about 10 nm. In some instances, excess low-k dielectric material may be removed using a suitable planarization technique, such as CMP, to provide a planar top surface as shown in FIGS. 9A and 9B. In some embodiments, the low-k dielectric material may include one or more porogens, such as hydrocarbon groups, and the first-type low-k dielectric feature 360 and the second-type low-k dielectric feature 362 may be porous after the porogens decompose. In some instances, an anneal process may be performed to decompose and drive out the porogens in the low-k dielectric material.

In embodiments represented in FIG. 9A, the first-type low-k dielectric feature 360 tracks the shape of the first-type opening 350 and has substantially vertical sidewalls (along Z direction) when viewed along the X direction. Similar to the first-type opening 350, a width of the first-type low-k dielectric feature 360 along Y direction is uniform or substantially uniform throughout the height of the first-type low-k dielectric feature 360 along Z direction. In embodiments represented in FIG. 9B, the second-type low-k dielectric feature 362 tracks the shape of the second-type opening 352. In some instances, an upper portion of the second-type openings 352 may be sandwiched between two of the second spacers 312 and a lower portion thereof may be defined between two of the first spacers 310 and has substantially vertical sidewalls (along Z direction) when viewed along the X direction. In these alternative implementations, the upper portion of the second-type low-k dielectric feature 362 has a first width W1 and the lower portion of the second-type low-k dielectric feature 362 has a second width W2. The first width W1 is greater than the second width W2.

Figure 10A:
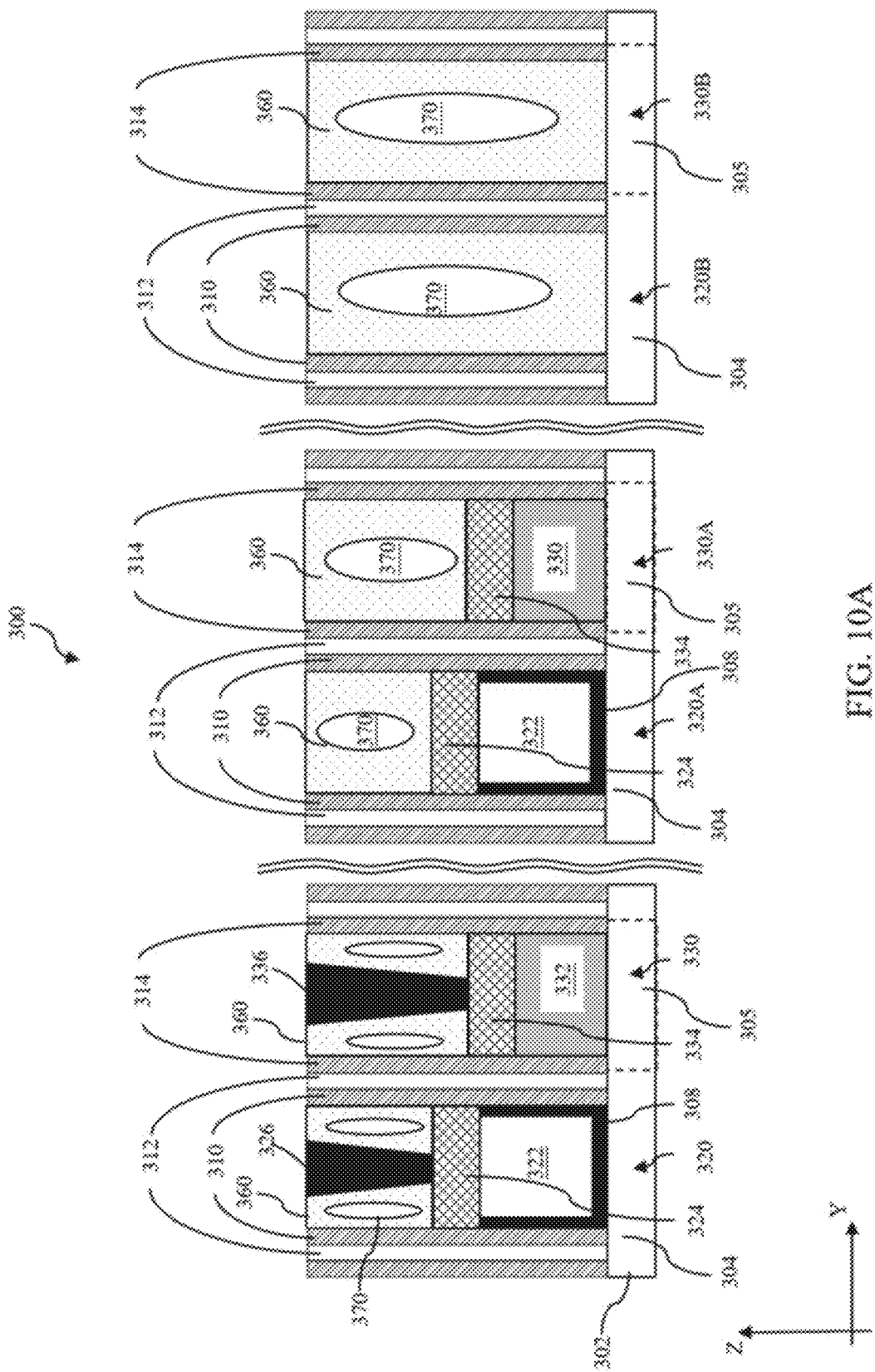
FIGS. 10A, 10B, 11A, and 11B provides cross-sectional views along a plane substantially parallel to a plane defined by section A-A' of FIG. 1 of various exemplary devices fabricated according to one or more steps of the method of FIG. 2.
Figure 10B:
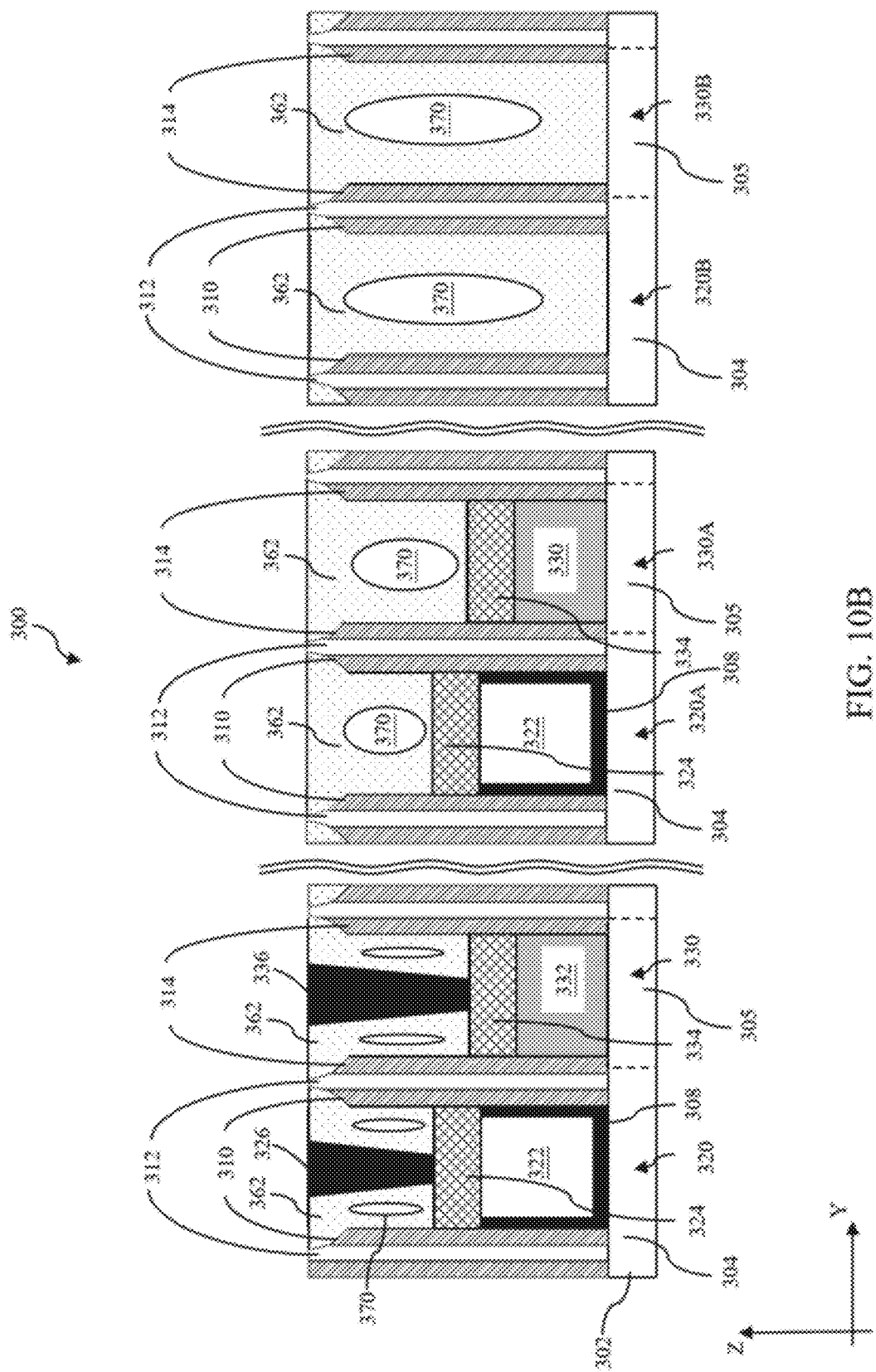

In some embodiments, at block 208, the low-k dielectric material is deposited in an isotropic manner such that the low-k dielectric material may thicken near both sides of the top edges of the first-type openings 350 in FIG. 8A or the second-type openings 352 in FIG. 8B and trap air to form air pockets 370 in FIGS. 10A and 10B, respectively. In some embodiments shown in FIGS. 10A and 10B, the air pockets 370 may be closed and completely surrounded by the first-type low-k dielectric feature 360 and the second-type low-k dielectric feature 362, respectively. In some alternative embodiments illustrated in FIGS. 11A and 11B, the air pockets may not be completely surrounded by the first-type low-k dielectric feature 360 and the second-type low-k dielectric feature 362 and may be referred to as open air pockets 372. In these embodiments, the open air pockets 372 each includes one or more openings through top surfaces of the gate structure 320, the source/drain contact structure 330, the gate structure 320A, source/drain contact structure 330A, gate cut feature 320B, and source/drain contact isolation feature 330B, respectively. It is noted that these open air pockets 372 may be sealed off by an ILD layer formed thereafter.

Figure 11A:
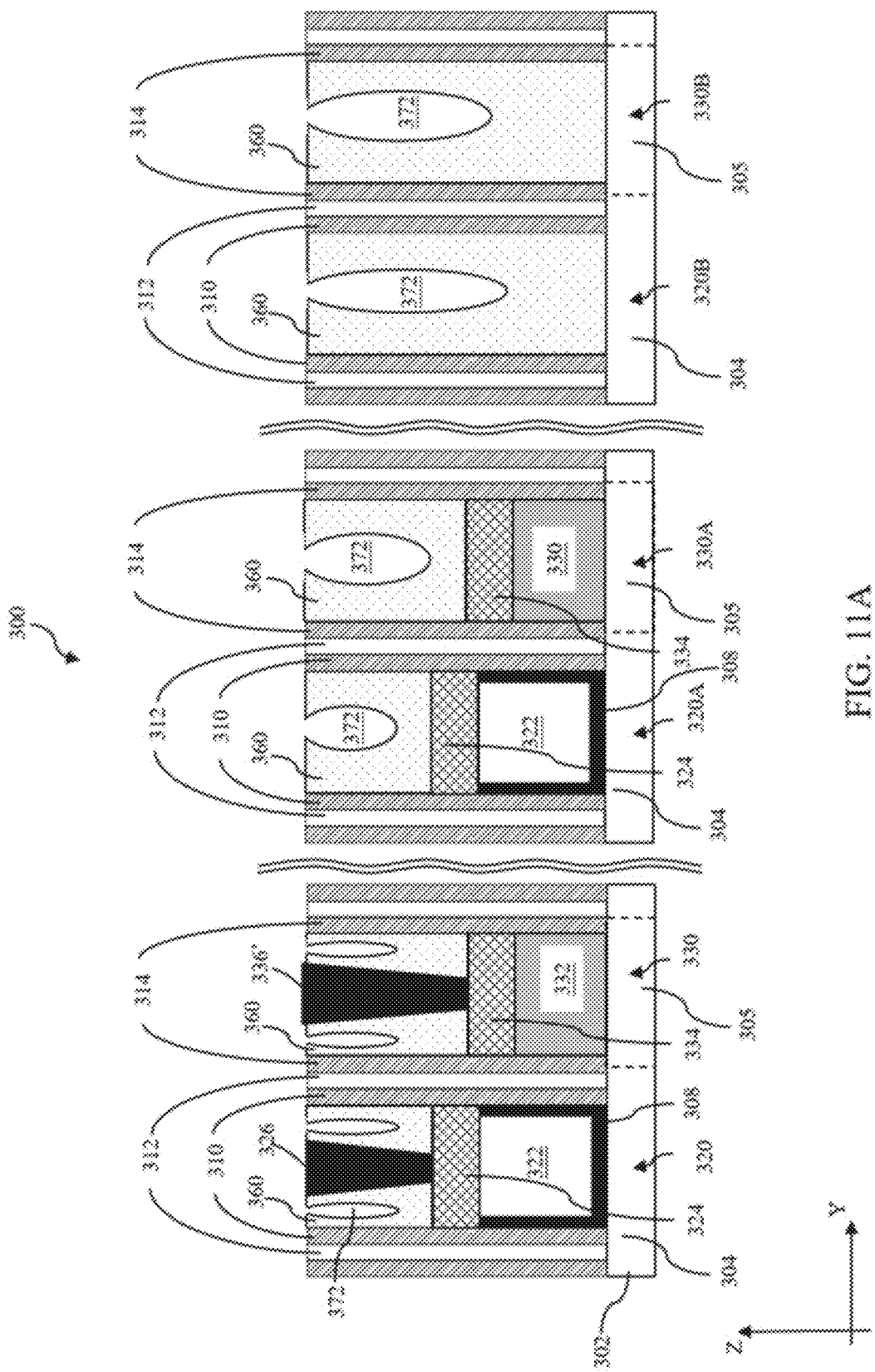
Figure 11B:
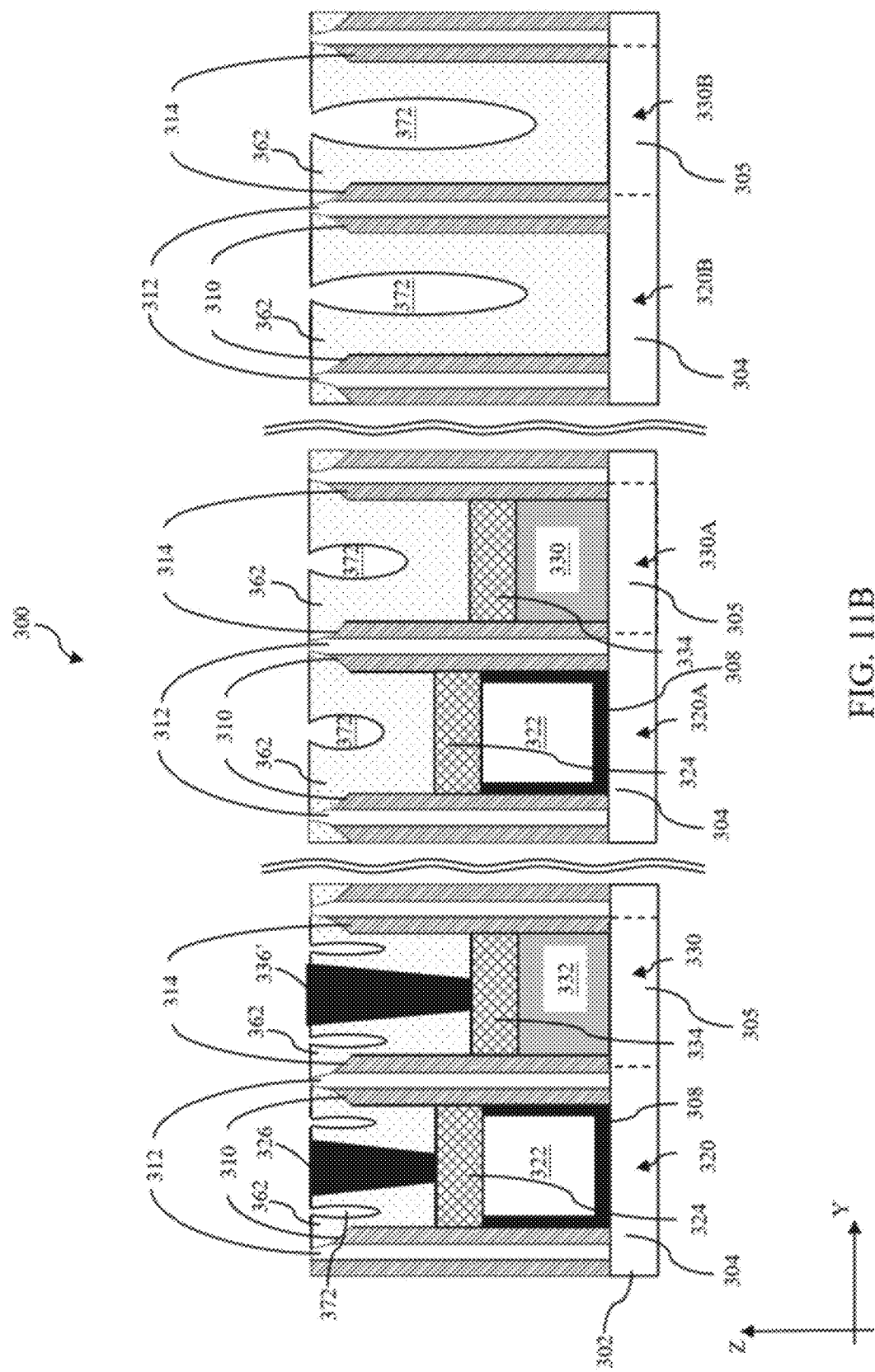

In some alternative embodiments illustrated in FIGS. 11A and 11B, the gate contact via 326 and an alternative source/drain contact via 336' may be formed separately and sequentially at block 204. For example, the gate contact via 326 may be formed using operations described with respect to block 204 and the alternative source/drain contact via 336' may then be formed using similar operations afterwards. For another example, the gate contact via 326 may be formed after the alternative source/drain contact via 336'. In these alternative embodiments, the gate contact via 326 and the alternative source/drain contact via 336' may not be coplanar and one of them may have a greater height relative to the substrate 102 (shown in FIG. 1) than the other.

Referring now to FIG. 2, the method 200 proceeds to block 210 where further processes are performed. For example, subsequent processing may form various multilayers interconnect features (e.g., metal layers and interlayer dielectric layers) configured to connect the various features to form a functional circuit that may include one or more FinFET devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure.

Thus, the various embodiments described herein offer several advantages over the existing art. For example, the semiconductor device of the present disclosure includes low-k dielectric features around the gate contact vias and source/drain contact vias to reduce parasitic capacitance. The low-k dielectric features are formed after the formation of the gate contact vias and the source/drain contact vias such that they do not need to withstand processes for formation the gate contact vias and the source/drain contact vias. It will be understood that not all advantages have been necessarily discussed herein, no particular advantage is required for all embodiments, and other embodiments may offer different advantages. Additional embodiments and advantages will be evident to those skilled in the art in possession of this disclosure.

Thus, one of the embodiments of the present disclosure provides a semiconductor device. The semiconductor device includes a fin extending from a substrate and including a channel region and a source/drain region adjacent to the channel region, a gate structure over the channel region, a source/drain contact over the source/drain region, a spacer extending along a sidewall of the gate structure, a liner extending along a sidewall of the source/drain contact, a gate contact via over and electrically coupled to the gate structure, the gate contact via extending through a first dielectric layer such that a portion of the first dielectric layer interposes between the gate contact via and the spacer, and a source/drain contact via over and electrically coupled to the source/drain contact. The source/drain contact via extends through a second dielectric layer such that a portion of the second dielectric layer interposes between the source/drain contact via and the liner. The first and second dielectric layers are formed of a same dielectric material.

In some embodiments, the dielectric material has a dielectric constant smaller than 4. In some embodiments, the first and second dielectric layers includes an air pocket. In some implementations, the first and second dielectric layers are porous. In some instances, the spacer includes aluminum oxide, aluminum oxynitride, aluminum nitride, zirconium oxide, zirconium aluminum oxide, zirconium nitride, hafnium oxide, or a combination thereof, and the first and second dielectric layers include silicon, oxygen, nitrogen, or carbon. In some embodiments, the first dielectric layer includes a lower portion closer to the gate structure and an upper portion away from the gate structure and the upper portion is wider than the lower portion. In some implementations, the second dielectric layer includes a lower portion closer to the source/drain contact and an upper portion away from the source/drain contact. The upper portion is wider than the lower portion.

In another of the embodiments, a semiconductor device is provided. The semiconductor device includes a fin extending along a direction and including a channel region and a source/drain region adjacent to the channel region, a gate structure over the channel region, a first dielectric feature over the gate structure, a source/drain contact over the source/drain region, a second dielectric feature over the source/drain contact, a gate contact via through the first dielectric feature and electrically coupled to the gate structure, a source/drain contact via through the second dielectric feature and electrically coupled to the source/drain contact, a spacer extending along a sidewall of the gate structure, and a liner extending along a sidewall of the source/drain contact. An upper portion of the first dielectric feature has a first width along the direction. A lower portion of the first dielectric feature has a second width along the direction and the first width is greater than the second width.

In some embodiments, an upper portion of the second dielectric feature has a third width along the direction; a lower portion of the second dielectric feature has a fourth width along the direction; and the third width is greater than the fourth width. In some embodiments, the first and second dielectric features have the same composition. In some instances, the first and second dielectric features have a dielectric constant smaller than 4. In some implementations, the first and second dielectric features includes an air pocket. In some embodiments, the first and second dielectric features are porous. In some instances, the spacer includes aluminum oxide, aluminum oxynitride, aluminum nitride, zirconium oxide, zirconium aluminum oxide, zirconium nitride, hafnium oxide, or a combination thereof and the first and second dielectric features include silicon, oxygen, nitrogen, or carbon.

In yet another of the embodiments, a method of forming a semiconductor device is provided. The method includes receiving a workpiece that includes a fin extending along a direction, and including comprising a channel region and a source/drain region adjacent to the channel region, a gate structure over the channel region, a first dielectric feature over the gate structure, a source/drain contact over the source/drain region, a second dielectric feature over the source/drain contact, a spacer extending along a sidewall of the gate structure, and a liner extending along a sidewall of the source/drain contact. The method further includes forming a gate contact via through the first dielectric feature to electrically couple to the gate structure, forming a source/drain contact via through the second dielectric feature to electrically couple to the source/drain contact, removing the first dielectric feature to form a first opening, removing the second dielectric feature to form a second opening, and forming a third dielectric feature in the first and second openings. The first dielectric feature has a first dielectric constant, the second dielectric feature has a second dielectric constant, and the third dielectric feature has a third dielectric constant. The third dielectric constant is smaller than the first dielectric constant.

In some embodiments, the removing of the first dielectric feature includes etching the spacer and the liner. In some implementations, the removing of the second dielectric feature includes etching the spacer and the liner. In some instances the forming of the gate contact via and the forming of the source/drain contact via are performed separately. In some embodiments, the first and second dielectric constants are greater than 4 and the third dielectric constant is smaller than 4. In some embodiments, the first and second dielectric feature include aluminum oxide, aluminum oxynitride, aluminum nitride, zirconium oxide, zirconium aluminum oxide, zirconium nitride, hafnium oxide, or a combination thereof and the third dielectric feature includes silicon, oxygen, nitrogen, or carbon.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
   receiving a workpiece comprising:
      a fin extending along a direction, the fin comprising a channel region and
      a source/drain region adjacent to the channel region,
      a gate structure over the channel region,
      a first dielectric feature over the gate structure,
      a source/drain contact over the source/drain region,
      a second dielectric feature over the source/drain contact,
      a spacer extending along a sidewall of the gate structure, and
      a liner extending along a sidewall of the source/drain contact;
   forming a gate contact via through the first dielectric feature to electrically couple to the gate structure;
   forming a source/drain contact via through the second dielectric feature to electrically couple to the source/drain contact;
   removing the first dielectric feature to form a first opening;
   removing the second dielectric feature to form a second opening; and
   forming a third dielectric feature in the first and second openings,
   wherein the first dielectric feature has a first dielectric constant, the second dielectric feature has a second dielectric constant, the third dielectric feature has a third dielectric constant,
   wherein the third dielectric constant is smaller than the first dielectric constant.

2. The method of claim 1, wherein the removing of the first dielectric feature comprises etching the spacer and the liner.

3. The method of claim 1, wherein the removing of the second dielectric feature comprises etching the spacer and the liner.

4. The method of claim 1, wherein the forming of the gate contact via and the forming of the source/drain contact via are performed separately.

5. The method of claim 1, wherein the first and second dielectric constants are greater than 4 and the third dielectric constant is smaller than 4.

6. The method of claim 1,
   wherein the first and second dielectric feature comprise aluminum oxide, aluminum oxynitride, aluminum nitride, zirconium oxide, zirconium aluminum oxide, zirconium nitride, hafnium oxide, or a combination thereof,
   wherein the third dielectric feature comprises silicon, oxygen, nitrogen, or carbon.

7. The method of claim 1, wherein the first opening is disposed between the gate contact via and the spacer.

8. The method of claim 1, wherein the second opening is disposed between the source/drain contact via and the liner.

9. A method, comprising:
   receiving a workpiece comprising:
      a gate structure,
      a first dielectric feature over the gate structure,
      a source/drain contact adjacent the gate structure,
      a second dielectric feature over the source/drain contact,
      a first spacer extending along a sidewall of the gate structure,
      a liner extending along a sidewall of the source/drain contact, and
      a second spacer directly sandwiched between the first spacer and the liner;
   forming a gate contact via through the first dielectric feature to electrically couple to the gate structure;
   forming a source/drain contact via through the second dielectric feature to electrically couple to the source/drain contact;
   after the forming of the gate contact via, removing the first dielectric feature to form a first opening;
   after the forming of the source/drain contact via, removing the second dielectric feature to form a second opening; and
   forming a third dielectric feature in the first and second openings.

10. The method of claim 9,
    wherein the first dielectric feature has a first dielectric constant, the second dielectric feature has a second dielectric constant, the third dielectric feature has a third dielectric constant,
    wherein the third dielectric constant is smaller than the first dielectric constant and the second dielectric constant.

11. The method of claim 9,
    wherein the workpiece further comprising a gate cap layer over the gate structure and a source/drain cap layer over the source/drain contact.

12. The method of claim 11,
    wherein the gate contact via lands on the gate cap layer,
    wherein the source/drain contact via lands on the source/drain cap layer.

13. The method of claim 11,
    wherein the gate cap layer comprises W, Co, Ni, Ru, Ti, Ta, TiN, TaN, or combinations thereof,
    wherein the source/drain cap layer comprises W, Co, Ni, Ru, Ti, Ta, TiN, TaN, combinations thereof.

14. The method of claim 9, wherein the forming of the gate contact via comprises:

depositing an etch stop layer and an interlayer dielectric layer over the first dielectric feature;

forming a gate contact via opening through the interlayer dielectric layer, the etch stop layer, and the first dielectric feature;

depositing a metal fill layer in the gate contact via opening; and after the depositing of the metal fill layer, planarizing the workpiece to expose the first dielectric feature.

15. The method of claim 9, wherein the forming of the source/drain contact via comprises:

depositing an etch stop layer and an interlayer dielectric layer over the second dielectric feature;

forming a source/drain contact via opening through the interlayer dielectric layer, the etch stop layer, and the second dielectric feature;

depositing a metal fill layer in the source/drain contact via opening; and after the depositing of the metal fill layer, planarizing the workpiece to expose the second dielectric feature.

16. The method of claim 9, wherein the first spacer comprises silicon oxide, silicon nitride, silicon carbide, silicon oxynitride, silicon oxy-carbide, silicon carbide nitride, silicon oxy-carbide nitride, or amorphous silicon, wherein the second spacer comprises aluminum oxide, aluminum oxynitride, aluminum nitride, zirconium oxide, zirconium aluminum oxynitride, or aluminum nitride, wherein the liner comprises silicon oxide, silicon nitride, silicon carbide, silicon oxynitride, silicon oxy-carbide, silicon carbide nitride, silicon oxy-carbide nitride, or amorphous silicon.

17. A method, comprising:
receiving a workpiece comprising:
a gate structure,
a gate cap layer over the gate structure,
a first dielectric feature over the gate cap layer,
a source/drain contact adjacent the gate structure,
a source/drain cap layer over the source/drain contact,
a second dielectric feature over the source/drain cap layer,
a first spacer extending along sidewalls of the gate structure, the gate cap layer and the first dielectric feature,
a liner extending along sidewalls of the source/drain contact, the source/drain cap layer and the second dielectric feature, and
a second spacer directly sandwiched between the first spacer and the liner;

forming a gate contact via through the first dielectric feature to contact the gate cap layer;

forming a source/drain contact via through the second dielectric feature to contact the source/drain cap layer;

after the forming of the gate contact via, removing the first dielectric feature to form a first opening between the gate contact via and the first spacer;

after the forming of the source/drain contact via, removing the second dielectric feature to form a second opening between the source/drain contact via and the liner; and forming a third dielectric feature in the first and second openings.

18. The method of claim 17, wherein the first spacer comprises silicon oxide, silicon nitride, silicon carbide, silicon oxynitride, silicon oxy-carbide, silicon carbide nitride, silicon oxy-carbide nitride, or amorphous silicon, wherein the second spacer comprises aluminum oxide, aluminum oxynitride, aluminum nitride, zirconium oxide, zirconium aluminum oxynitride, or aluminum nitride, wherein the liner comprises silicon oxide, silicon nitride, silicon carbide, silicon oxynitride, silicon oxy-carbide, silicon carbide nitride, silicon oxy-carbide nitride, or amorphous silicon.

19. The method of claim 17, wherein the removing of the first dielectric feature comprises etching the first spacer and the liner.

20. The method of claim 17, wherein the removing of the second dielectric feature comprises etching the first spacer and the liner.

* * * * *